(12) United States Patent  
Kim

(10) Patent No.: US 6,750,540 B2  
(45) Date of Patent: Jun. 15, 2004

(54) MAGNETIC RANDOM ACCESS MEMORY USING SCHOTTKY DIODE

(75) Inventor: Chang Shuk Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/320,048

(22) Filed: Dec. 16, 2002

(65) Prior Publication Data

US 2003/0116847 A1 Jun. 26, 2003

(30) Foreign Application Priority Data

Dec. 26, 2001 (KR) ........................................ 2001-84901

(51) Int. Cl.7 .......................................... H01L 27/095
(52) U.S. Cl. ................. 257/741; 257/E27.026; 257/E29.327; 365/171; 365/173; 365/230.07
(58) Field of Search .................. 257/741, E27.026, 257/E29.327, 145, 421, E45.001; 365/171, 173, 230.07

(56) References Cited

U.S. PATENT DOCUMENTS 5,640,343 A * 6/1997 Gallagher et al. .......... 365/171  
5,793,697 A * 8/1998 Scheuerlein ........... 365/230.07  
6,072,718 A * 6/2000 Abraham et al. ........... 365/173

\* cited by examiner

*Primary Examiner*—David Nelms  
*Assistant Examiner*—Dao H. Nguyen  
(74) *Attorney, Agent, or Firm*—Marshall, Gerstein & Borun LLP

(57) ABSTRACT

A magnetic random access memory (MRAM) using a Schottky diode is disclosed. In order to achieve high integration of the memory device, a word line is formed on a semiconductor substrate without using a connection layer and a stacked structure including an MTJ cell, a semiconductor layer and a bit line is formed on the word line, thereby forming the Schottky diode between the MTJ cell and the bit line. As a result, a structure of the device is simplified, and the device may be highly integrated due to repeated stacking.

8 Claims, 6 Drawing Sheets

MAGNETIC RANDOM ACCESS MEMORY USING SCHOTTKY DIODE

BACKGROUND

1. Technical Field

The present invention relates to a magnetic random access memory (abbreviated as 'MRAM') and, in particular, to an improved MRAM having a higher speed than a SRAM, integration as high as a DRAM, and a property of a nonvolatile memory such as a flash memory, and connecting a plurality of resistance transfer devices to one diode.

2. Description of the Related Art

Most of the semiconductor memory manufacturing companies have developed MRAM's using a ferromagnetic material as the next generation of memory devices.

The MRAM is a memory device for reading and writing information by forming multi-layer ferromagnetic thin films and sensing current variations according to a magnetization direction of the respective thin films. The MRAM has a high speed, low power consumption and high integration density due to the special properties of the magnetic thin film, and performs a nonvolatile memory operation such as a flash memory.

The MRAM utilizes either a giant magneto resistive (abbreviated as 'GMR') phenomenon or a spin-polarized magneto-transmission (SPMT) phenomenon generated due to influence of the spin on electron transmission to effect memory function. An MRAM using the GMR phenomenon utilizes the property that resistance is remarkably varied when spin directions are different in two magnetic layers having a non-magnetic layer therebetween in order to implement a GMR magnetic memory device. The MRAM using the SPMT phenomenon utilizes the property that larger current transmission is generated when spin directions are identical in two magnetic layers having an insulating layer therebetween in order to implement a magneto-transmission junction memory device.

MRAM research, however, is still in its early stages, and is mostly concentrated on the formation of multi-layer magnetic thin films, with less research on unit cell structure and peripheral sensing circuits.

FIGS. 1 and 2 are a cross-sectional diagram and a plan diagram, respectively illustrating a conventional MRAM disclosed under U.S. Pat. No. 5,640,343. FIG. 2, being a schematic plan diagram, illustrates the operation principles of an MRAM array.

Referring to FIG. 1, the conventional MRAM includes a word line 13 formed on a semiconductor substrate 11, a diode 19 being formed on the word line 11 and having N/P type impurity layers 15 and 17, a connection layer 21 formed on the diode 19 and a magnetic tunnel junction (MTJ) cell 25 formed on the connection layer 21.

A conventional method for fabricating the MRAM illustrated in FIG. 1 will now be described. First, the word line 13 is formed on the semiconductor substrate 11 and the diode 19 is formed thereon. Here, the diode 19 includes the N/P type impurity layers 15 and 17. The diode 19 is formed by an ion implant process after depositing a polysilicon layer, or by depositing a doped polysilicon layer.

In the case where the diode 19 is formed by an ion implant process, a subsequent high temperature thermal process is required. When the diode 19 is formed using the doped polysilicon layer, the diode 19 is deteriorated at a temperature higher than a predetermined temperature, which destroys thermal reliability of the MTJ cell. Therefore, a succeeding process is performed after forming a connection layer. As a result, the structure of the device is complicated, and high integration of the device is difficult to achieve.

A first interlayer insulating film 23 is formed to planarize the top surface of the diode 19, and a contact hole (not shown) exposing the diode 19 is formed by removing the first interlayer insulating film 23 on the diode 19. Connection layer 21 is then formed to contact the diode 19 through the contact hole. Here, the connection layer 21 is formed by forming a tungsten layer filling up the contact hole on the resultant structure, and evenly etching the tungsten layer. Thereafter, the MTJ cell 25 is formed to contact the connection layer 21.

A second interlayer insulating film 27 is then formed to planarize the entire top surface of the resultant structure, and the MRAM is fabricated according to a succeeding process.

The operation of the MRAM will now be described.

A write operation of the MRAM is performed by applying current $I_B$ and current $I_W$ to generate a magnetic field and by selecting a cell in which the current $I_B$ and the current $I_W$ cross each other. A read operation of the MRAM is carried out by applying a voltage to a bit line of a selected cell so that a current can flow in a word line through the MTJ cell and a resistance of the PN junction diode and by sensing the current.

FIG. 2 illustrates a word line control circuit 31 to which both end portions of a first word line 33, a second word line 35 and a third word line 37 are connected, and a bit line control circuit 41 to which both end portions of a first bit line 43, a second bit line 45 and a third bit line 47 crossing the first to third word lines 33, 35 and 37 are connected. In particular, a unit cell having the MTJ cell "b" and the PN junction diode "c" is formed at an intersecting area of the word line and the bit line.

A magnetic field "a" is generated due to the flow of the current $I_B$ flowing through the first to third bit lines 43, 45 and 47 and the current $I_W$ flowing through the first to third word lines 33, 35 and 37. The write operation is performed by selecting the cell in which the current $I_B$ and the current $I_W$ cross each other. In addition, the current generated due to difference between the voltage applied to the bit line of the selected cell and a reference voltage flows in the word line through the MTJ cell and the resistance of the diode. The read operation is executed by sensing the current.

As described above, since the conventional MRAM is formed by using one PN junction diode and one MTJ cell, which is a resistance-varying device, only two bits are stored in one cell, making it difficult to achieve high integration of the device. Moreover, the connection layer must be formed to prevent the properties of the device from being deteriorated due to the high temperature thermal process, thereby complicating the structure of the device and deteriorating the properties of the device. In addition, high integration of the device is difficult to achieve.

SUMMARY OF THE DISCLOSURE

Presently, a magnetic random access memory (MRAM) using a Schottky diode is disclosed that allows high integration of the device by constructing the memory device with a plurality of diodes and a plurality of resistance-varying devices. In particular, an MRAM having a semiconductor layer between an MTJ cell and a bit line is utilized.

According to an aspect of the disclosed device, a magnetic random access memory is provided that utilizes a Schottky diode having a magnetic tunnel junction (MTJ) cell, a bit line and a semiconductor layer disposed between the MTJ cell and the bit line wherein either a metal layer for the bit line or a metal layer on a top portion of the MTJ cell forms a Schottky barrier of the Schottky diode.

According to another aspect of the disclosure, a magnetic random access memory utilizing a Schottky diode includes a stacked structure. The stacked structure, in turn, is comprising a word line, a MTJ cell, a semiconductor layer and a bit line. Additionally, the stacked structure is repeatedly formed on a semiconductor substrate an n number of times, wherein n is a natural number as used hereinafter.

According to another aspect of the disclosure, a magnetic random access memory utilizing a Schottky diode is disclosed that includes a stacked structure comprising a word line, a first semiconductor layer, a MTJ cell, a second semiconductor layer and a bit line. The stacked structure is repeatedly formed on a semiconductor substrate an n number of times.

According to yet another aspect of the disclosure, a magnetic random access memory utilizing the Schottky diode is provided that includes a stacked structure comprised of a word line, a MTJ cell, a doped polysilicon layer and a bit line. The stacked structure is repeatedly formed on a semiconductor substrate an n number of times.

DETAILED DESCRIPTION OF THE
PRESENTLY PREFERRED EMBODIMENTS

FIGS. 3 through 6 are cross-sectional diagrams respectively illustrating an MRAM having a Schottky diode and a resistance-varying device in accordance with various embodiments to be disclosed herein. Here, an MTJ cell is used as the resistance-varying device.

Figure 1:
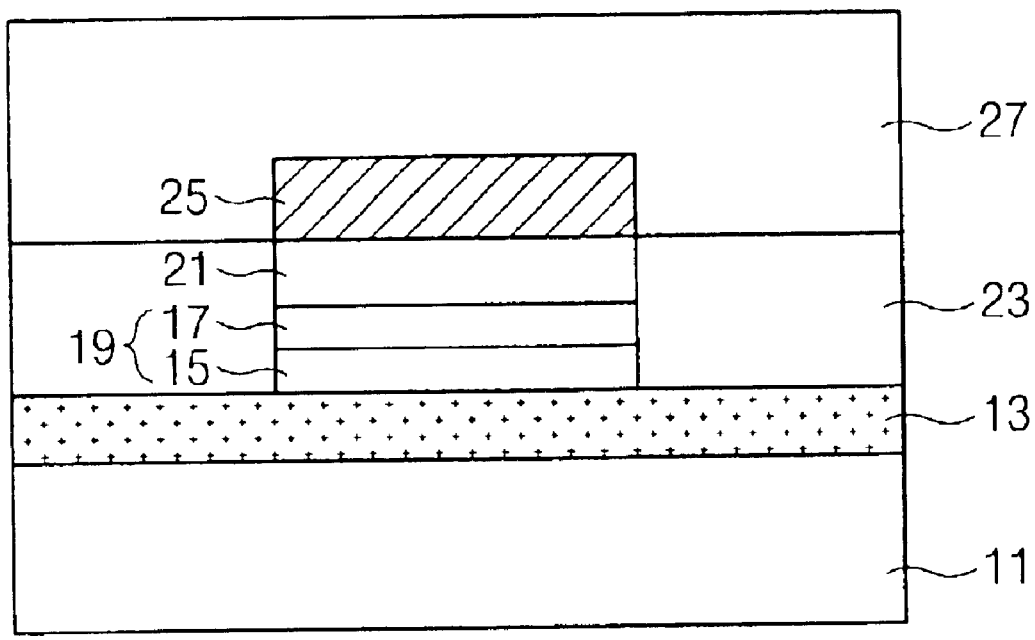
FIG. 1 is a cross-sectional diagram illustrating a conventional MRAM.
Figure 2:
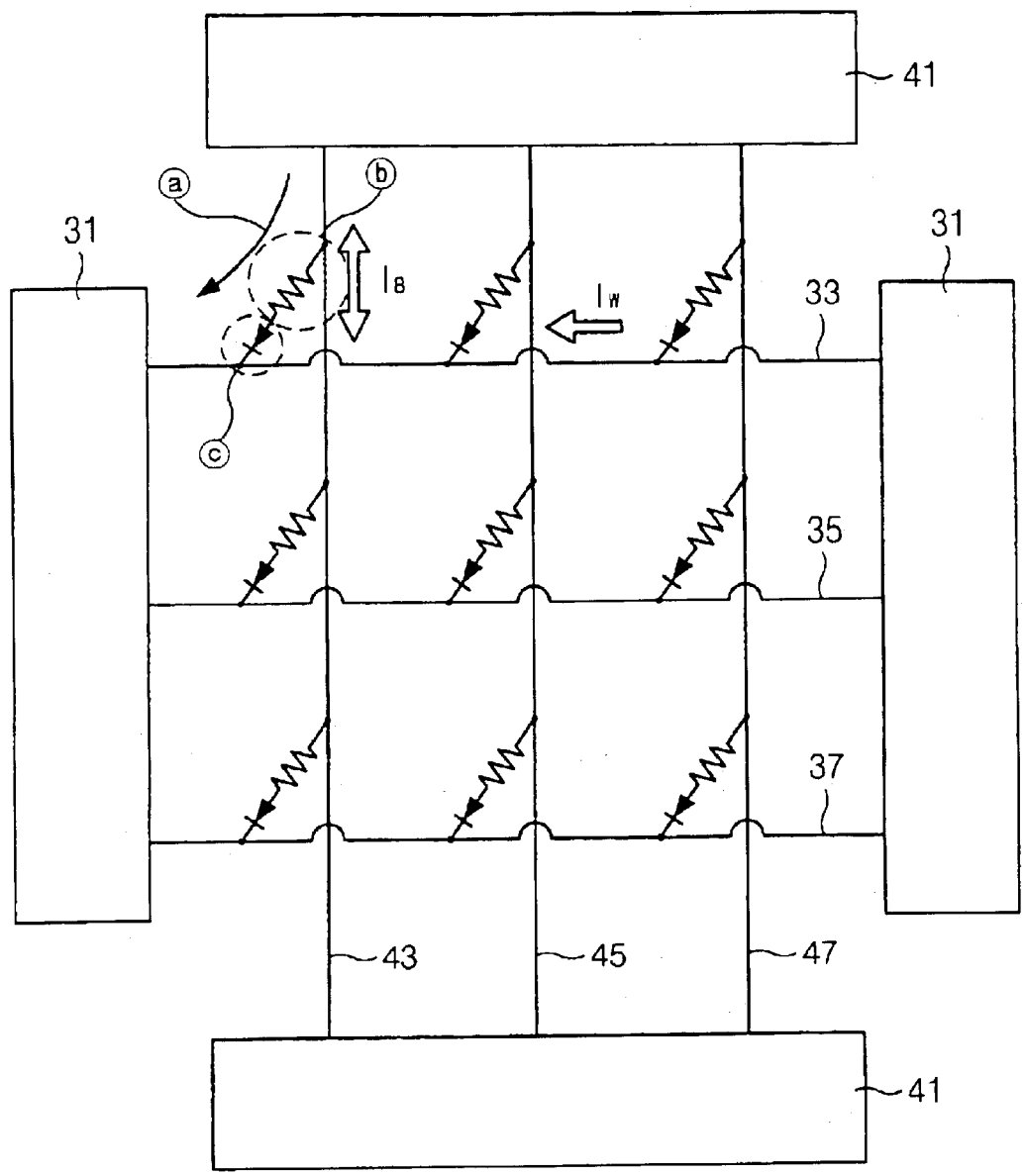
FIG. 2 is a plan diagram illustrating an operation principle of an MRAM array.
Figure 3:
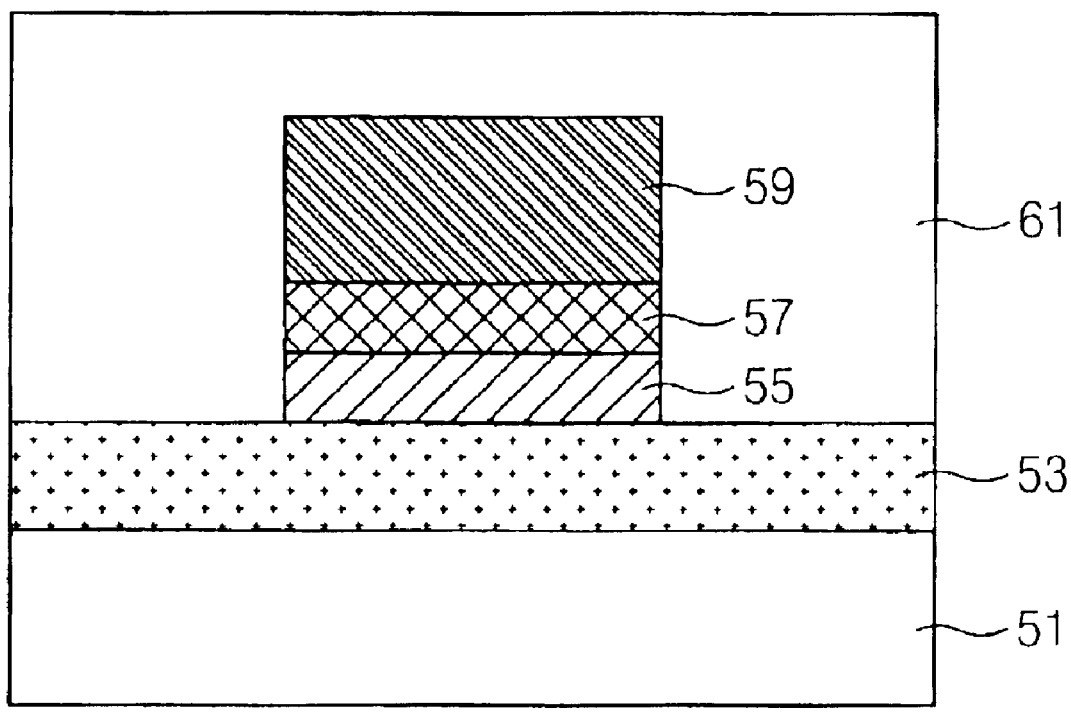
FIGS. 3 through 6 are cross-sectional diagrams respectively illustrating an MRAM in accordance with various embodiments of the disclosed MRAM.

FIG. 3 is a cross-sectional diagram illustrating the MRAM in accordance with an embodiment. Here, a word line 53 is formed on a semiconductor substrate 51 and a stacked structure comprising an MTJ cell 55, a doped polysilicon layer 57 and a bit line 59 is formed on the word line 53. A metal layer comprising the bit line 59 on the doped polysilicon layer 57 or a metal layer (not shown) on the top portion of the MTJ cell 55 below the doped polysilicon layer 57 is used as a metal electrode for forming a Schottky barrier. In general, the MTJ cell 55 comprises a stacked structure of a pinned ferromagnetic layer (not shown), a tunnel oxide film (not shown) and a free ferromagnetic layer (not shown). The tunnel oxide film is formed of $Al_2O_3$, and the pinned ferromagnetic layer and the free ferromagnetic layer are formed of an alloy mainly composed of Pt, Ni, Mn, Co and Fe.

A planarized interlayer insulating film 61 is formed to cover the stacked structure of the MTJ cell 55, the doped polysilicon layer 57 and the bit line 59. Here, the doped polysilicon layer 57 is formed according to a low temperature deposition process below a limit temperature for maintaining thermal reliability of the MTJ cell 55.

Figure 4:
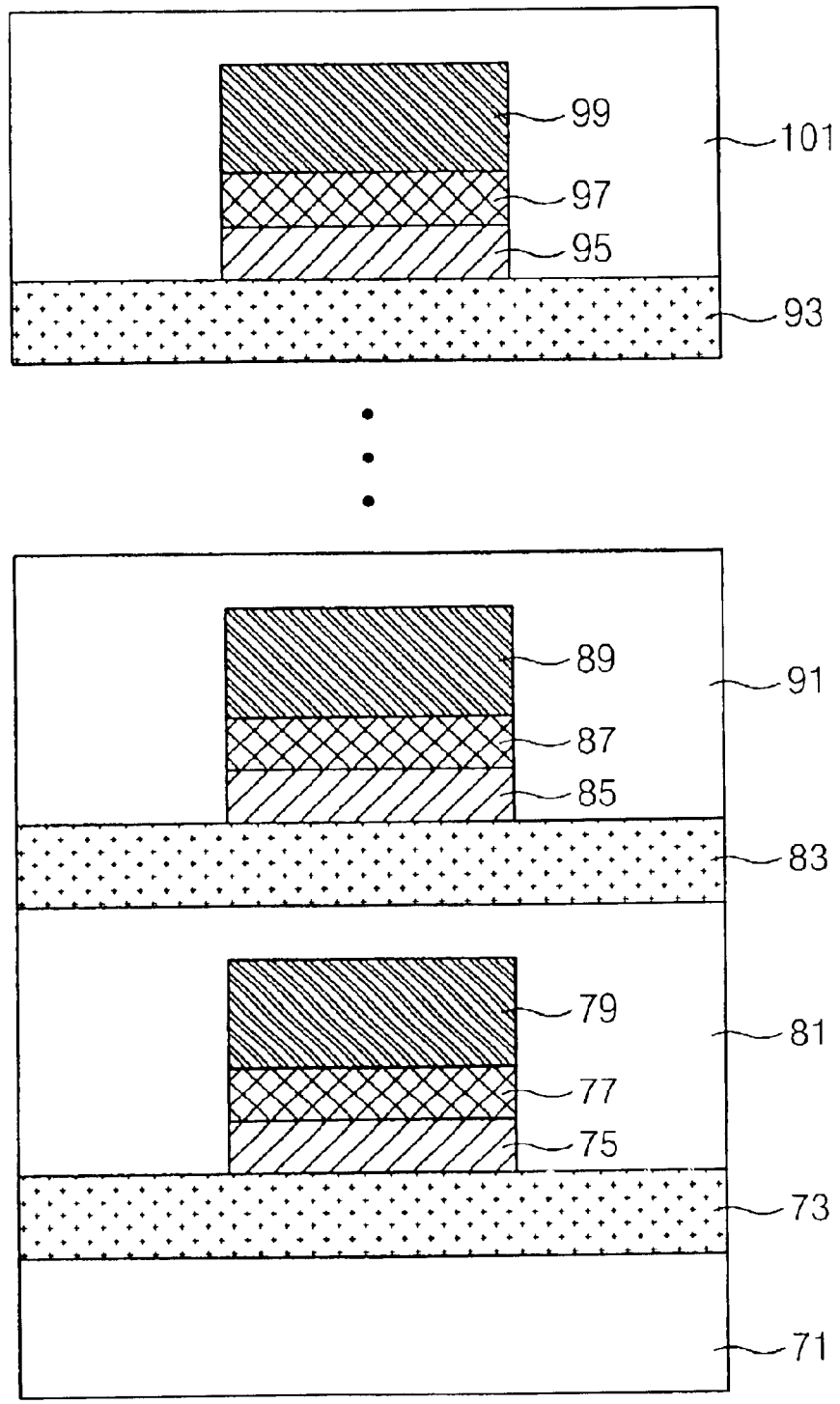

FIG. 4 is a cross-sectional diagram illustrating an MRAM in accordance with a second embodiment. Referring to FIG. 4, a word line 73 is formed on a semiconductor substrate 71, and a first MTJ cell 75, a first doped polysilicon layer 77 and a first bit line 79 are sequentially formed on the word line 73. Here, a metal layer comprising the first bit line 79 on the first doped polysilicon layer 77 or a metal layer (not shown) on the top portion of the first MTJ cell 75 below the first doped polysilicon layer 77 is used as a metal electrode for forming a schottky barrier. In general, the first MTJ cell 75 has a stacked structure of a pinned ferromagnetic layer (not shown), a tunnel oxide film (not shown) and a free ferromagnetic layer (not shown). The tunnel oxide film is formed of $Al_2O_3$, and the pinned ferromagnetic layer and the free ferromagnetic layer are formed of an alloy mainly composed of Pt, Ni, Mn, Co and Fe.

A planarized first interlayer insulating film 81 is formed to cover the stacked structure of the first MTJ cell 75, the first doped polysilicon layer 77 and the first bit line 79. A second word line 83 is formed on the first interlayer insulating film 81. Here, the second word line 83 is connected to a separate power line different from the first word line 73.

A stacked structure of a second MTJ cell 85, a second doped polysilicon layer 87 and a second bit line 89 is formed to contact the upper portion of the second word line 83 on the stacked structure of the first MTJ cell 75, the first doped polysilicon layer 77 and the first bit line 79. A second interlayer insulating film 91 is formed to planarize the top surface of the resultant structure.

The stacked structure of the second word line 83, the second MTJ cell 85, the second doped polysilicon layer 87 and the second bit line 89 is repeatedly formed on the second interlayer insulating film 91. Accordingly, the stacked structure of an n-th word line 93, an n-th MTJ cell 95, an n-th doped polysilicon layer 97 and an n-th bit line 99 is formed on the top layer, and an n-th interlayer insulating film 101 is formed to planarize the resultant structure.

Here, the doped polysilicon layers 77, 87 and 97 are formed according to a low temperature deposition process below a limit temperature for maintaining thermal reliability of the MTJ cell 75.

Figure 5:
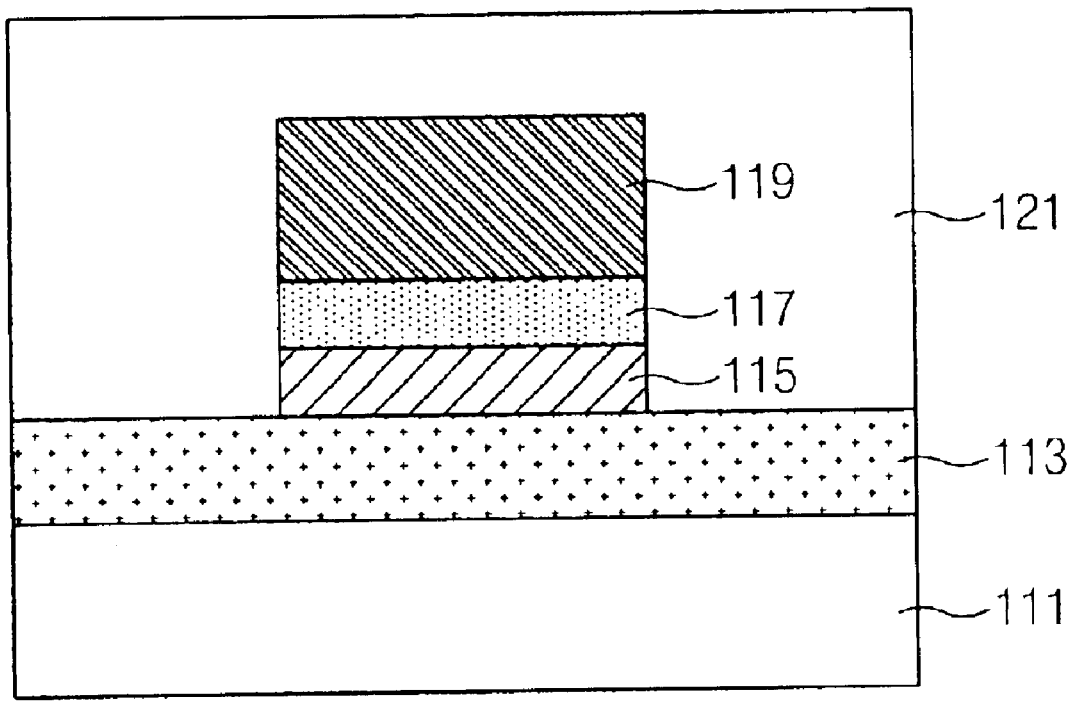

FIG. 5 is a cross-sectional diagram illustrating the MRAM in accordance with a third embodiment of the present disclosure.

Referring to FIG. 5, a word line 113 is formed on a semiconductor substrate 111 and a first MTJ cell 115, a semiconductor layer 117 and a bit line 119 are sequentially formed on the word line 113. Here, a metal layer comprising the bit line 119 on the semiconductor layer 117 or a metal layer (not shown) on the top portion of the MTJ cell 115 below the semiconductor layer 117 is used as a metal electrode for forming a Schottky barrier. In general, the MTJ cell 115 has a stacked structure of a pinned ferromagnetic layer (not shown), a tunnel oxide film (not shown) and a free ferromagnetic layer (not shown). The tunnel oxide film is formed of $Al_2O_3$, and the pinned ferromagnetic layer and the free ferromagnetic layer are formed of an alloy mainly composed of Pt, Ni, Mn, Co and Fe.

A planarized interlayer insulating film 121 is formed to cover the stacked structure of the MTJ cell 115, the semiconductor layer 117 and the bit line 119. Here, the semiconductor layer 117 is formed according to a low temperature deposition process below a limit temperature for maintaining thermal reliability of the MTJ cell 115.

Figure 6:
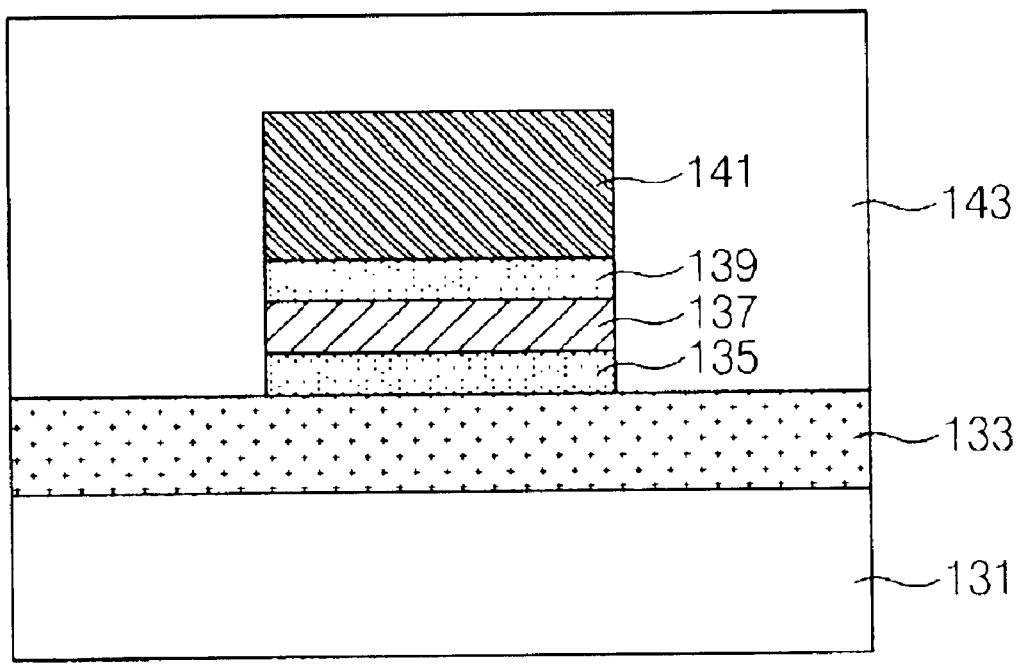

FIG. 6 is a cross-sectional diagram illustrating a MRAM in accordance with a fourth embodiment of the present disclosure. Referring to FIG. 6, a word line 133 is formed on a semiconductor substrate 131 and a first semiconductor layer 135, a first MTJ cell 137, a second semiconductor layer 139 and a bit line 141 are sequentially formed on the word line 133. Here, a metal layer comprising the bottom layer of the MTJ cell 137 on the first semiconductor layer 135 or a metal layer comprising the word line below the first semiconductor layer 135 is used as a metal electrode for forming a Schottky barrier. In addition, a metal layer composing the bit line 141 on the second semiconductor layer 139 or a metal layer (not shown) of the top portion of the MTJ cell 137 below the second semiconductor layer 139 is employed as the metal electrode for forming the Schottky barrier. In general, the MTJ cell 137 has a stacked structure of a pinned ferromagnetic layer (not shown), a tunnel oxide film (not shown) and a free ferromagnetic layer (not shown). The tunnel oxide film is formed of $Al_2O_3$, and the pinned ferromagnetic layer and the free ferromagnetic layer are formed of an alloy mainly composed of Pt, Ni, Mn, Co and Fe.

A planarized interlayer insulating film 143 is formed to cover the stacked structure of the first semiconductor layer 135, the MTJ cell 137, the second semiconductor layer 139 and the bit line 141. Here, the first and second semiconductor layers 135 and 139 are formed according to the low temperature deposition process below a limit temperature for maintaining thermal reliability of the MTJ cell 137.

According to another aspect of the present disclosed devices, the MRAM formed in the third or fourth embodiments disclosed herein is stacked as in the second embodiment.

In the conventional MRAM comprising one diode and one resistance-varying device, the read/write operation can be performed only $10^5$ to $10^6$ times. In accordance with the teachings of the present invention, improved performance results from a MRAM formed as the stacked structure of the word line, the MTJ cell, the doped polysilicon layer and the bit line by employing a Schottky diode using rectification of a Schottky barrier generated in an interface of metal and semiconductor. Therefore, the structure of the device can be simplified, high integration of the device can be achieved due to the multi-layer structure and the whole fabrication process of the device can be simplified.

As described previously, the doped polysilicon layer is formed according to a low temperature deposition process below a limit temperature for maintaining thermal reliability of the MTJ cell. A metal layer of the top portion of the MTJ or a metal layer composing the bit line can be used as a metal electrode of the Schottky barrier, and a metal electrode can be inserted into the upper or lower portion of the doped polysilicon layer. When the Schottky barrier is formed in the MTJ side, an ohmic contact is formed in the bit line side. When the Schottky barrier is formed in the bit line side, the ohmic contact is formed in the MTJ side. According to the formation method and structure of the Schottky barrier, the Schottky diode has a forward bias property from the MTJ to the bit line or from the bit line to the MTJ.

An amount of electric charges stored in the diode interface is reduced by using a Schottky diode in place of a PN junction diode, thereby improving a reading speed. Moreover, since the high temperature thermal process deteriorating the property of the MTJ after the ion implant process and the general process for forming the doped polysilicon layer are omitted, a connection pair of the Schottky diode and the MTJ cell can be repeatedly stacked. Theoretically, the memory device can be infinitely integrated.

Here, a magneto-resistance device having a resistance value varied due to magnetization or magnetism, such as the MTJ, AMR, GMR, spin valve, ferromagnetic substance/metal semiconductor hybrid structure, III–V group magnetic semiconductor composite structure, metal (semi-metal)/semiconductor composite structure, and colossal magnetoresistance (CMR), and a phase transformation device having a resistance value varied according to material phase transformation due to an electric signal are employed as the resistance transfer device.

As discussed earlier, the connection pair of the MTJ cell and the bit line is formed on the word line formed on the semiconductor substrate and the doped polysilicon layer or semiconductor layer is positioned to form the Schottky diode between the MTJ cell and the bit line. As a result, the structure of the device is simplified, and the device is highly integrated due to repeated stacking.

While the teachings of the invention have been explained with respect to particular examples, it will be apparent to those of ordinary skill in the art that the scope of this patent is not limited to those examples. On the contrary, this patent covers all apparatuses and methods falling within the spirit and scope of the appended claims, either literally or under the doctrine of equivalents.

What is claimed is:

1. A magnetic random access memory utilizing a Schottky diode comprising:
    a magnetic tunnel junction (MTJ) cell;
    a bit line; and
    a semiconductor layer disposed between the MTJ cell and the bit line, wherein either a metal layer for the bit line or a metal layer disposed on a top portion of the MTJ cell and the semiconductor layer form a Schottky barrier of a Schottky diode.

2. The magnetic random access memory according to claim 1, wherein the semiconductor layer is formed according to a low temperature deposition process below a prescribed temperature for maintaining thermal reliability of the MTJ cell.

3. A magnetic random access memory utilizing a Schottky diode comprising:
    a stacked structure comprising:
        a word line;
        a magnetic tunnel junction (MTJ) cell;
        a semiconductor layer; and
        a bit line;
    wherein either a metal layer for the bit line or a metal layer disposed on a top portion of the MTJ cell and the semiconductor layer form a Schottky barrier of a Schottky diode and wherein the stacked structure is repeatedly formed on a semiconductor substrate a plurality of times.

4. The magnetic random access memory according to claim 3, wherein the semiconductor layer is formed according to a low temperature deposition process below a prescribed temperature for maintaining thermal reliability of the MTJ cell.

5. A magnetic random access memory utilizing a Schottky diode comprising:
    a stacked structure comprising:
        a word line;
        a first semiconductor layer;
        a magnetic tunnel junction (MTJ) cell;
        a second semiconductor layer; and
        a bit line;
    wherein either a metal layer for the bit line or a metal layer disposed on a top portion of the MTJ cell and the semiconductor layer form a Schottky barrier of a Schottky diode and wherein the stacked structure is repeatedly formed on a semiconductor substrate a plurality of times.

6. The magnetic random access memory according to claim 5, wherein each of the first and the second semiconductor layers is formed according to a low temperature deposition process below a prescribed temperature for maintaining thermal reliability of the MTJ cell.

7. A magnetic random access memory utilizing a Schottky diode comprising:

a stacked structure comprising:
   a word line;
   a magnetic tunnel junction (MTJ) cell;
   a doped polysilicon layer; and
   a bit line;

wherein either a metal layer for the bit line or a metal layer disposed on a top portion of the MTJ cell and the semiconductor layer form a Schottky barrier of a Schottky diode and wherein the stacked structure is repeatedly formed on a semiconductor substrate a plurality of times.

8. The magnetic random access memory according to claim 7, wherein the doped polysilicon layer is formed according to a low temperature deposition process below a prescribed temperature for maintaining thermal reliability of the MTJ cell.

* * * * *